(12) United States Patent
Yeuan

(10) Patent No.: US 6,218,247 B1
(45) Date of Patent: Apr. 17, 2001

(54) METHOD FOR FABRICATING MASK ROM

(75) Inventor: Che-Shyng Yeuan, Hsinchu Hsien (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/251,952

(22) Filed: Feb. 17, 1999

(30) Foreign Application Priority Data

Nov. 23, 1998 (TW) .................................................. 87119380

(51) Int. Cl.$^7$ .............................................. H01L 21/8246

(52) U.S. Cl. ............................................ 438/275; 438/276

(58) Field of Search ....................................... 438/275–278

(56) References Cited

U.S. PATENT DOCUMENTS 5,681,772  * 10/1997 Chen et al. .
5,744,394  *  4/1998 Iguchi et al. .......................... 438/276

* cited by examiner

*Primary Examiner*—Jey Tsai
(74) *Attorney, Agent, or Firm*—Thomas, Kayden, Horstemeyer & Risley

(57) ABSTRACT

A method for fabricating a mask ROM. Source/drain regions are formed in a provided substrate. Channels are formed between the adjacent source/drain regions. A plurality of code ion implant regions and a plurality of plug ion implant regions are formed in some channels and some source/drain regions, respectively. A dielectric layer is formed over the substrate. Contact openings are formed in the dielectric layer to expose the plug ion implant regions. Contact plugs are formed within the contact openings to electrically couple with the plug ion implant regions.

20 Claims, 4 Drawing Sheets

METHOD FOR FABRICATING MASK ROM

CROSS-REFERENCE TO RELATED APPLICATION

This application claims the priority benefit of Taiwan application serial no. 87119380, filed Nov. 23, 1998, the full disclosure of which is incorporated herein by reference.

BACKGROUND OF THE INVENTION

1. Field of the Invention

The present invention relates to a method of fabricating a memory device. More particularly, the present invention relates to a method for fabricating a mask ROM.

2. Description of the Related Art

As the power of the microprocessor becomes stronger and the operation complexity of software increases, the requirement for memory grows. Therefore, it is now the most important task of semiconductor manufacturers to fabricate low cost and high-density memories. Memories can be divided into two categories: read only memory (ROM) and random access memory (RAM). ROM includes mask ROM, programmable ROM (PROM), erasable programmable ROM (EPROM) and electrically erasable programmable ROM (EEPROM).

Currently, the most commonly used type of ROM device is called an electrically erasable programmable ROM (EEPROM). The EEPROM device allows data or programs to be erased or written bit by bit. Data can be repeatedly read, written, and erased several times. Recently, data access speeds of 70 to 80 ns have been achieved, in what is called a flash memory by Intel. The flash memory has a structure similar to the structure of an EPROM device. The data or programs are erased or written block by block. Only one or two seconds are necessary to complete an erasure. This can save a lot of time and results in a lower fabrication cost.

RAM includes static random access memory (SRAM) and dynamic random access memory (DRAM).

Usually, ROM uses channel transistors as memory cells. During programming, dopants are selectively implanted into certain channel regions to modify the threshold voltage and to turn memory cells ON/OFF. ROM includes polysilicon word lines crossing bit lines. The channel of a memory cell is below a word line and between two bit lines. The implantation of ions into the channel determines the binary data "0" or "1".

As the size of semiconductor devices decreases to below 0.6 $\mu$m, a plug ion implantation process must be performed between the step of forming a contact opening in the inter-layer dielectric layer and the step of forming a contact plug in the inter-layer dielectric layer to prevent a junction leakage effect and a spiking effect, which occur at the junction of the contact opening and the source/drain region.

FIG. 1A is a schematic, top view of a mask ROM.

Referring to FIGS. 1A and 1B, a gate oxide layer 102 is formed on a p-type substrate 100. Gates 104 are formed over the substrate 100 as word lines. An ion implantation process is performed by using gates 104 as masks to form n-type source/drain regions as bit lines. The bit lines cross the word lines perpendicularly. Channels are formed below the word lines. The state of each memory cell is determined by the channels. The method of closing the channels is to implant p-type ions into specific channels 107 to form code ion implant regions 110.

FIGS. 1B through 1E are schematic, cross-sectional diagrams used to depict steps in a conventional method for fabricating a mask ROM.

Referring to FIG. 1B, a p-type substrate 100 is provided. An isolation region 101 is formed in the substrate 100. A gate oxide layer 102 and gates 104 are formed in sequence on the substrate 100.

An ion implantation process is performed by using n-type ions as dopants to form a plurality of source/drain regions 106 in the substrate 100. Channels 107 are formed between two adjacent source/drain regions 106.

Referring to FIG. 1C, a patterned photoresist layer 108 is formed over the substrate 100 to expose subsequently formed code ion implant regions. An ion implantation process is performed by using phosphorus-31 as a dopant. The implantation energy is 160 KeV and the dosage of the dopant is about $1 \times 10^{14}$ ions/cm$^2$. After performing an annealing process at 850° C., code ion implant regions 110 are formed. The photoresist layer 108 is removed.

Referring to FIG. 1D, a borophosphosilicate glass layer 112 is formed over the substrate 100 by chemical vapor deposition. A flow process is performed to planarize the borophosphosilicate glass layer 112.

A photoresist layer 118 is formed on the borophosphosilicate glass layer 112. A contact opening 120 is formed in the borophosphosilicate glass layer 112 to expose a portion of the source/drain region 106a.

An ion implantation process is performed by using phosphorus-31 as a dopant. The implantation energy is 70 KeV and the dosage of the dopants is about $2 \times 10^{15}$ ions/cm$^2$. A reflow process is performed at 850° C. A plug ion implant region 122 is formed in the source/drain region 106a.

Referring to FIG. 1E, a barrier layer 124 is formed in the contact opening 120. A contact plug 126 is formed in the contact opening 120 to electrically couple with the plug ion implant region 122 located in the source/drain region 106a.

As the size of semiconductor devices decreases to below 0.6 $\mu$m, a plug ion implantation process must be performed after the code ion implantation process. This means that at least two ion implantation processes are performed in the conventional process. The manufacturing time is long and the manufacturing costs are high.

SUMMARY OF THE INVENTION

Accordingly, the purpose of the present invention is to provide a method for fabricating a mask ROM which simplifies the manufacturing process by simultaneously performing a code ion implantation process and a plug ion implantation process.

To achieve these and other advantages and in accordance with the purpose of the invention, as embodied and broadly described herein, the invention provides a method for fabricating a mask ROM. The method for fabricating this mask ROM includes the following steps. Gates are formed on a provided substrate. A plurality of source/drain regions is formed in the substrate. A plurality of channels is formed between the adjacent source/drain regions. An ion implantation process is performed to form a plurality of code ion implant regions and a plurality of plug ion implant regions in some channels and some source/drain regions, respectively. A dielectric layer is formed over the substrate. A plurality of contact openings is formed in the dielectric layer to expose the plug ion implant regions. A plurality of contact plugs is formed in the contact openings to electrically couple with the plug ion implant regions.

In the invention, the code ion implantation regions and the plug ion implantation regions are formed in the same process, so that only one mask is used and one ion implantation process is performed. As a result, the manufacturing process is simpler than the conventional manufacturing process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
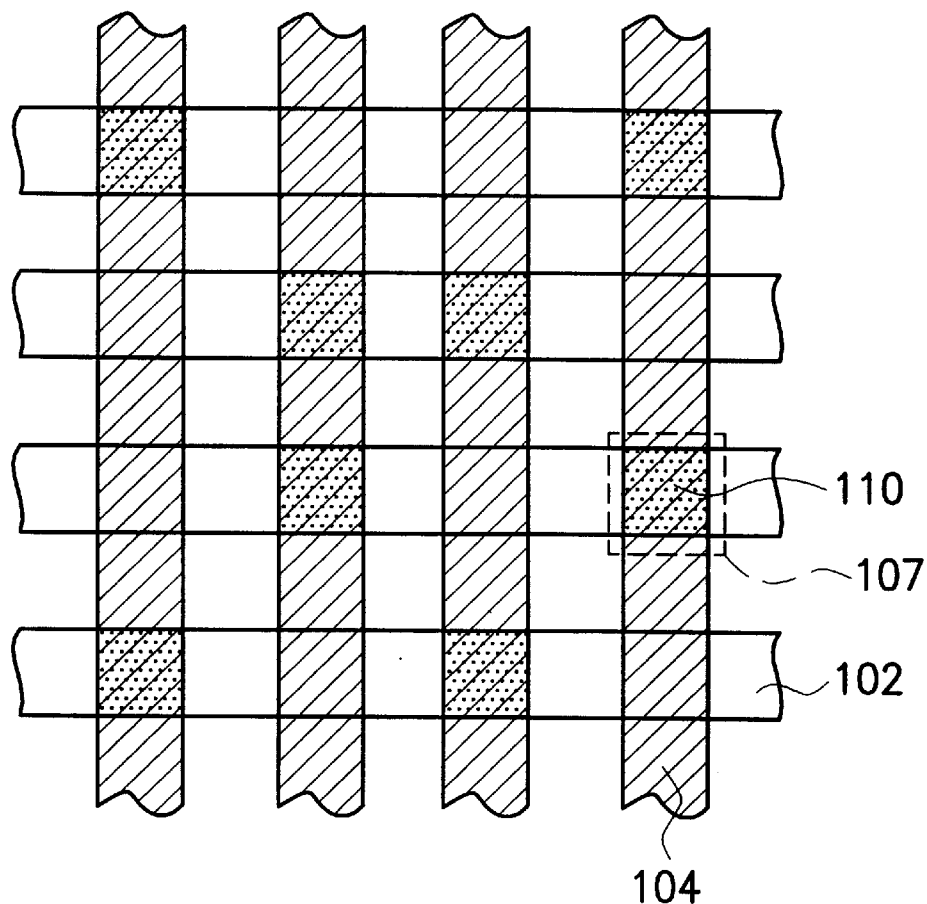
FIG. 1A is a schematic, top view of a mask ROM.
Figure 1B:
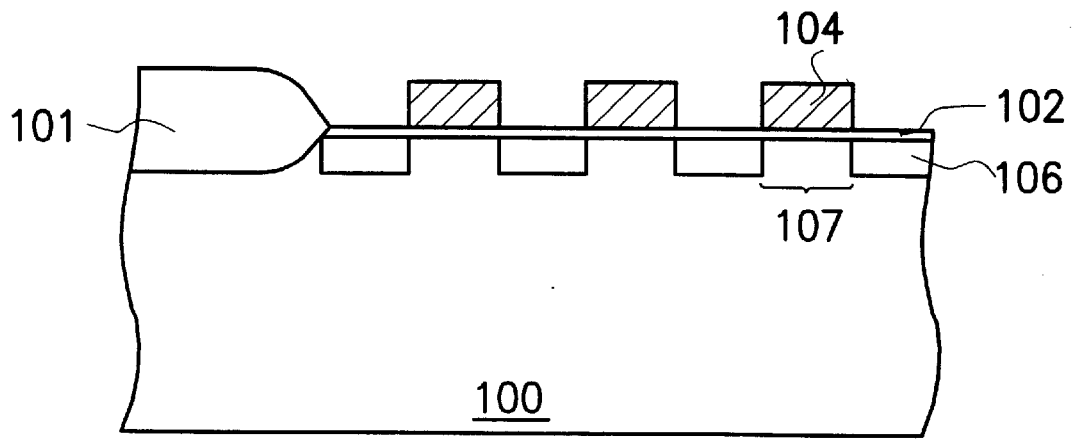
FIGS. 1B through 1E are schematic, cross-sectional diagrams used to depict steps in a conventional method for fabricating a mask ROM.
Figure 1C:
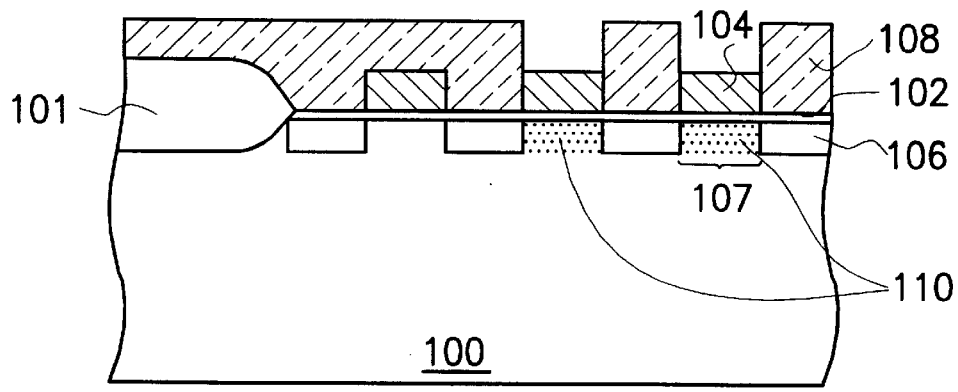
Figure 1D:
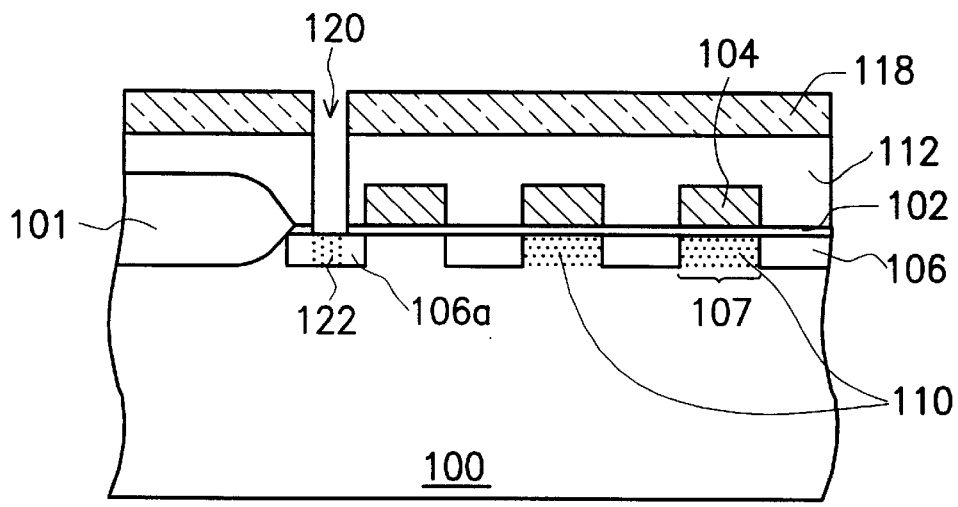
Figure 1E:
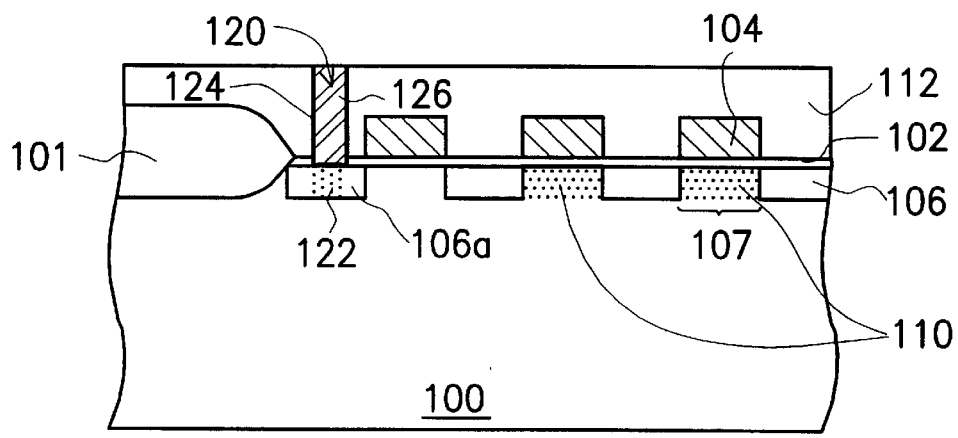

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic, cross-sectional diagrams used to depict steps in a method according to the invention for fabricating a mask ROM.

Figure 2A:
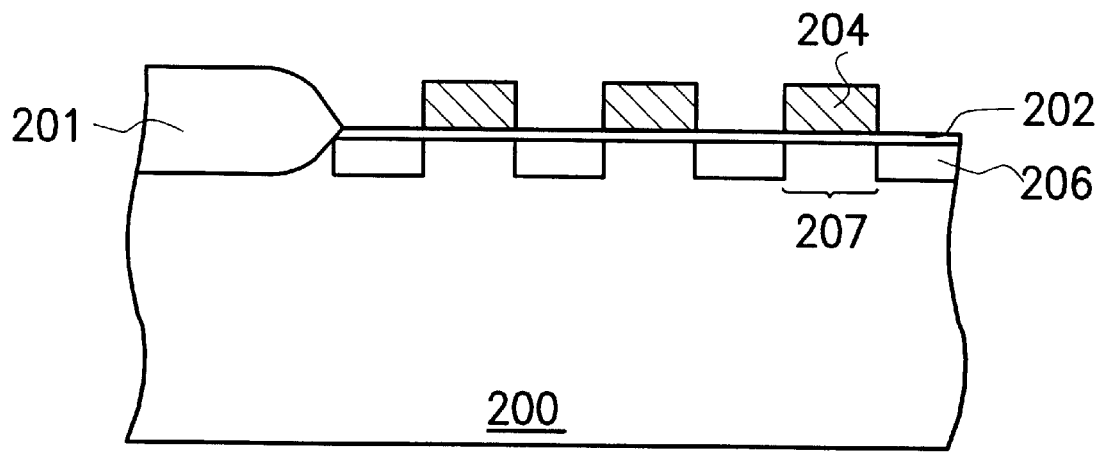
FIGS. 2A through 2D are schematic, cross-sectional diagrams used to depict steps in a method according to the invention for fabricating a mask ROM.

Referring to FIG. 2A, a p-type substrate 200 is provided. An isolation region 201 such as field oxide layer is formed in the substrate 200 to define an active region. A gate oxide layer 202 and a polysilicon layer (not shown) are formed in sequence on the substrate 200 to form gates 204. The step of forming the gate oxide layer 202 includes thermal oxidation and the step of forming the polysilicon layer includes chemical vapor deposition, wherein the thickness of the polysilicon layer is about 1000 to 4000 Å. An ion implantation process is performed by using, for example, n-type ions as dopants to form source/drain regions 206 in the substrate 200. Channels 207 are formed between two adjacent source/drain regions 206.

Figure 2B:
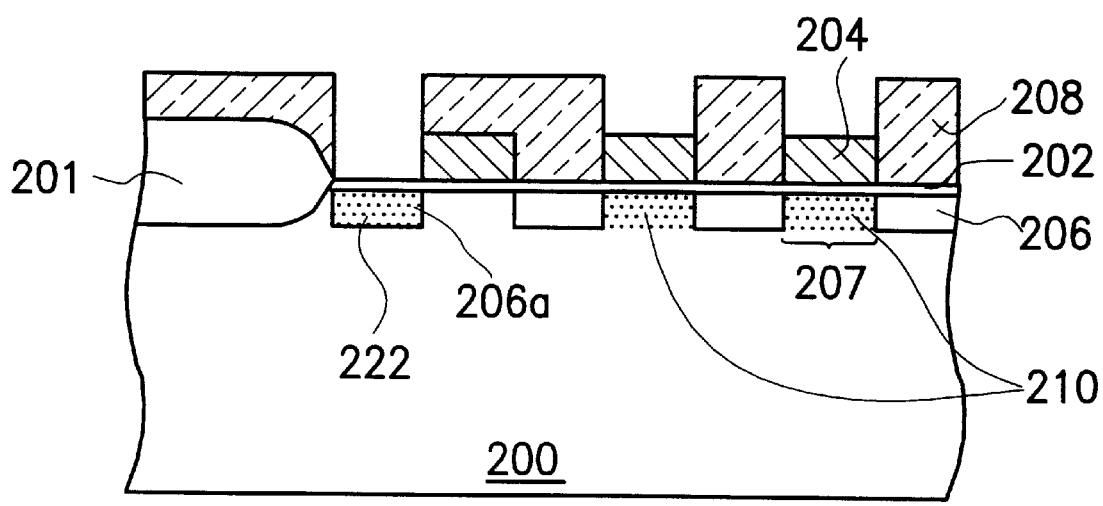

Referring to FIG. 2B, a patterned photoresist layer 208 is formed over the substrate 200 to expose some channels 207 and some source/drain regions 206, where code ion implant regions and plug ion implant regions are subsequently formed. The step of forming the photoresist layer 208 includes using a mask for simultaneously forming code ion implant regions and a mask for forming plug ion implant regions, and then, performing a photolithography process. An ion implantation process is performed by using, for example, n-type ions such as phosphorus-31 as dopants. The implantation energy is about 60 to 80 KeV and the dosage of the dopants is about $2 \times 10^{15}$ to $3 \times 10^{15}$ ions/cm$^2$. After performing an annealing process at about 850° C., a plurality of code ion implant regions 210 located in the channels 207 and plug ion implant regions 222 located in the source/drain regions 206a are formed. The photoresist layer 208 is removed.

In the ion implantation process, the dosage for forming the code ion implant regions is less than the one for forming the plug ion implant regions. The ions which are implanted in the code ion implant regions need to pass through the gates 204, and some ions are consumed. The amount of the ions consumed is about 10 percent of the dosage. Thus, the dosage implanted in the code ion implant regions is approximately equal to the predetermined dosage for forming the plug ion implant regions. The code ion implant regions and the plug ion implant regions can be formed simultaneously.

The mask for forming the code ion implant regions and the mask for forming the plug ion implant regions are used simultaneously. Thus, the bias region of the contact opening for forming the plug ion implant regions needs to be enlarged by about 0.2 μm to prevent misalignment while forming the contact opening.

Figure 2C:
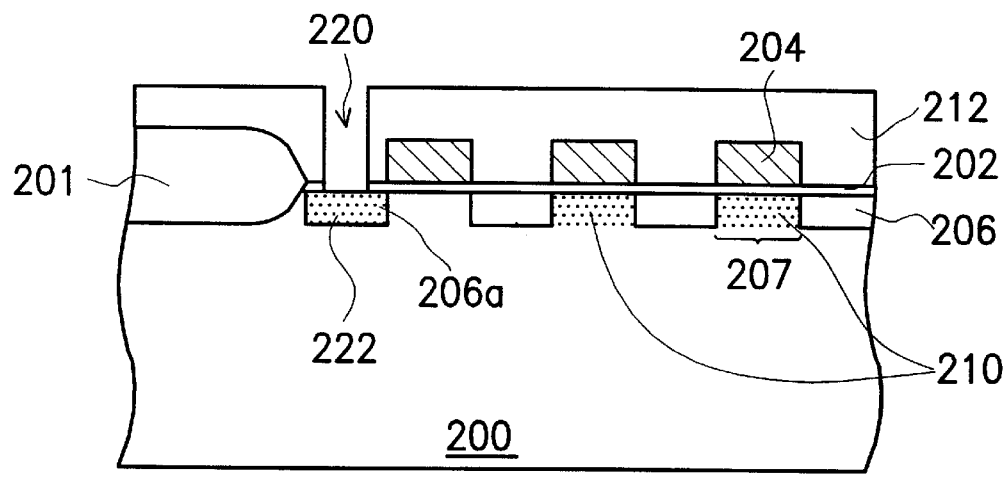

Referring to FIG. 2C, a dielectric layer 212 is formed over the substrate 200. The dielectric layer 212 includes borophosphosilicate glass. The step of forming the dielectric layer 212 includes depositing a borophosphosilicate glass layer and performing a flow process to planarize the borophosphosilicate layer.

A contact opening 220 is formed in the dielectric layer 212 to expose the plug ion implant region 222 located in the source/drain region 206a. A reflow process is performed.

Figure 2D:
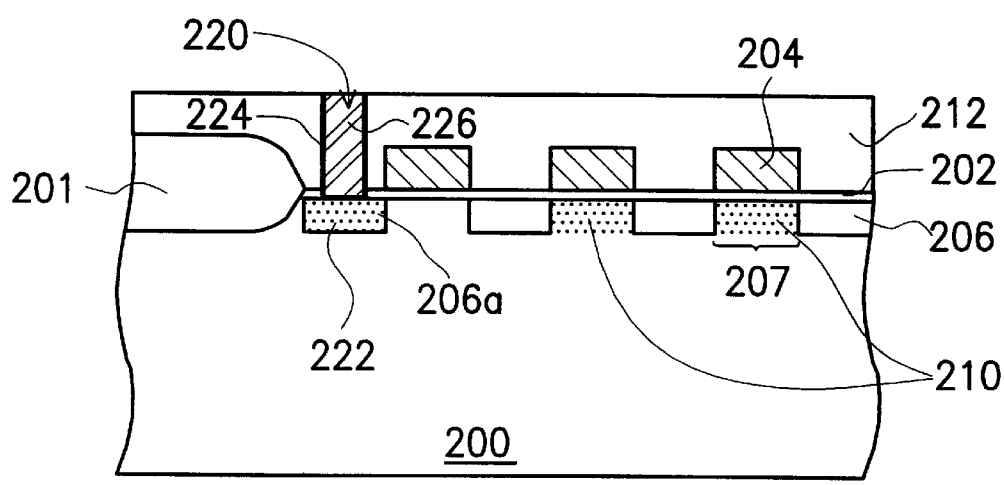

Referring to FIG. 2D, a conformal barrier layer 224 is formed within the contact opening 220 to enhance the adhesive force between the subsequently formed contact plug and the dielectric layer 212. The suitable material used to form the conformal barrier layer 224 is selected from a group comprising titanium/titanium nitride and tantalum/tantalum nitride.

A contact plug 226 is formed within the contact opening 220 to electrically couple with the plug ion implant region 222 located in the source/drain region 206a.

According to the foregoing, the advantages of the invention include the following:

1. In the invention, the code ion implantation process and the plug ion implantation process are performed simultaneously, so that the process is simplified. The dosage for forming the code ion implant regions is less than the one for forming the plug ion implant regions. Some ions, about 10 percent of the dosage, are consumed while forming the code ion implant regions. Thus, the dosage implanted in the code ion implant regions is approximately equal to the predetermined dosage for forming the plug ion implant regions. The code ion implant regions and the plug ion implant regions can be formed simultaneously.

2. The mask for forming the code ion implant regions and the mask for forming the plug ion implant regions are used simultaneously. Thus, the bias region of the contact opening for forming the plug ion implant regions needs to be enlarged by about 0.2 μm. This can prevent misalignment problems during the step of forming the plug ion implant regions.

3. The process in this invention is compatible with the conventional process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and the equivalents.

What is claimed is:

1. A method of fabricating a mask ROM, comprising the steps of:

forming a plurality of gates on a provided substrate and a plurality of source/drain regions in the substrate, wherein a plurality of channels is presented between the source/drain regions;

forming a patterned photoresist layer on the substrate to expose some channels and some source/drain regions;

performing an ion implantation process to form a plurality of code ion implant regions and a plurality of plug ion implant regions in the channels and the source/drain regions, which are exposed by the photoresist layer, respectively;

removing the photoresist layer;

forming a dielectric layer on the substrate;

forming a plurality of contact openings in the dielectric layer to expose the plug ion implant regions; and forming a plurality of contact plugs within the contact openings, wherein the contact plugs are electrically coupled with the plug ion implant regions.

2. The method of claim 1, wherein the step of forming the patterned photoresist layer to expose some channels and some source/drain regions includes using a mask for forming the code ion implant regions and a mask for forming the plug ion implant regions simultaneously, and performing a photolithography process.

3. The method of claim 1, wherein the implantation energy is about 60 to 80 KeV and the dosage of the dopants is about $2\times10^{15}$ to $3\times10^{15}$ ions/cm$^2$.

4. The method of claim 1, wherein phosphorus-31 is used as a dopant in the implantation process.

5. The method of claim 1, further comprising the step of performing an annealing process after the ion implantation process.

6. The method of claim 1, wherein the dielectric layer includes borophosphosilicate glass.

7. The method of claim 1, further comprising the step of forming a conformal barrier layer within the contact openings before forming the contact plugs.

8. The method of claim 7, wherein the material used to form the conformal barrier layer is selected from a group consisting of titanium/titanium nitride and tantalum/tantalum nitride.

9. A method of fabricating a mask ROM, comprising the steps of:

forming a plurality of gates on a provided substrate and a plurality of source/drain regions in the substrate, wherein a plurality of channels are presented between the source/drain regions;

forming a plurality of code ion implant regions and a plurality of plug ion implant regions simultaneously in some channels and some source/drain regions, respectively;

forming a dielectric layer over the substrate;

forming a plurality of contact openings in the dielectric layer to expose the plug ion implant regions; and forming a plurality of contact plugs within the contact openings, wherein the contact plugs are electrically coupled with the plug ion implant regions.

10. The method of claim 9, wherein the step of forming the code ion implant regions and the plug ion implant regions comprises:

forming a patterned photoresist layer to expose some channels and some source/drain regions;

performing an ion implantation process to form a plurality of code ion implant regions and a plurality of plug ion implant regions in the channels and the source/drain regions, which are exposed by the photoresist layer, respectively; and removing the photoresist layer.

11. The method of claim 10, wherein the step of forming the photoresist layer to expose some channels and some source/drain regions includes using a mask for simultaneously forming the code ion implant regions and a mask for forming the plug ion implant regions, and performing a photolithography process.

12. The method of claim 10, wherein the implantation energy is about 60 to 80 KeV and the dosage of the dopants is about $2\times10^{15}$ to $3\times10^{15}$ ions/cm$^2$.

13. The method of claim 10, wherein phosphorus-31 is used as a dopant in the implantation process.

14. The method of claim 10, further comprising the step of performing an annealing process after the ion implantation process.

15. The method of claim 9, wherein the dielectric layer includes borophosphosilicate glass.

16. The method of claim 9, further comprising the step of forming a conformal barrier layer within the contact openings before forming the contact plugs.

17. The method of claim 16, wherein the material used to form the conformal barrier layer is selected from a group consisting of titanium/titanium nitride and tantalum/tantalum nitride.

18. A method of fabricating a mask ROM, comprising the steps of:

forming a plurality of gates on a provided substrate and a plurality of source/drain regions in the substrate, wherein a plurality of channels are presented between the source/drain regions; and forming a plurality of code ion implant regions and a plurality of plug ion implant regions simultaneously in some channels and some source/drain regions, respectively.

19. The method of claim 18, wherein the step of forming the code ion implant regions and the plug ion implant regions further comprises:

forming a patterned photoresist layer to expose some channels and some source/drain regions by using a mask for forming the code ion implant regions and a mask for forming the plug ion implant regions simultaneously, and performing a photolithography process;

performing an ion implantation process to form a plurality of code ion implant regions and a plurality of plug ion implant regions in the channels and the source/drain regions, which are exposed by the photoresist layer, respectively; and removing the photoresist layer to expose some channels and some source/drain regions.

20. The method of claim 19, further comprising the step of performing an anneal process after the ion implantation process.

* * * * *